United States Patent
Zebhauser et al.

(10) Patent No.: US 10,116,072 B2
(45) Date of Patent: Oct. 30, 2018

(54) PRINTED CIRCUIT BOARD ASSEMBLY

(71) Applicant: ROSENBERGER HOCHFREQUENZTECHNIK GMBH & CO. KG, Fridolfing (DE)

(72) Inventors: Martin Zebhauser, Laufen (DE); Christian Schmidt, Wernberg-Köblitz (DE)

(73) Assignee: Rosenberger Hochfrequenztechnik GmbH & Co. KG, Fridolfing (DE)

( * ) Notice: Subject to any disclaimer, the term of this patent is extended or adjusted under 35 U.S.C. 154(b) by 0 days.

(21) Appl. No.: 15/523,137

(22) PCT Filed: Oct. 21, 2015

(86) PCT No.: PCT/EP2015/002083
§ 371 (c)(1),
(2) Date: Apr. 28, 2017

(87) PCT Pub. No.: WO2016/070958
PCT Pub. Date: May 12, 2016

(65) Prior Publication Data
US 2017/0317439 A1 Nov. 2, 2017

(30) Foreign Application Priority Data
Nov. 6, 2014 (DE) .................. 20 2014 008 843 U

(51) Int. Cl.
*H01R 13/73* (2006.01)
*H01R 12/71* (2011.01)
(Continued)

(52) U.S. Cl.
CPC ....... *H01R 12/716* (2013.01); *H01R 12/7082* (2013.01); *H05K 1/111* (2013.01);
(Continued)

(58) Field of Classification Search
CPC .. H01R 12/716; H01R 12/7082; H05K 1/111; H05K 2201/10189; H05K 2201/10325; H05K 2201/10356; H05K 2201/10878
(Continued)

(56) References Cited

U.S. PATENT DOCUMENTS 4,693,528 A * 9/1987 Asick .................. H01R 12/714
29/843
5,174,539 A * 12/1992 Leonard ................. F16M 11/22
248/300

(Continued)

FOREIGN PATENT DOCUMENTS

CN 101095381 A 12/2007
DE 202013006295 U1 9/2013

*Primary Examiner* — Abdullah Riyami
*Assistant Examiner* — Vladimir Imas
(74) *Attorney, Agent, or Firm* — Robert Curcio; DeLio, Peterson & Curcuio, LLC

(57) ABSTRACT

A printed circuit board assembly having a printed circuit board with at least one footprint for attaching a plug connector, wherein the footprint has three or more coupling points for coupling electrical contacts of the plug connector, and a plug connector attached on the footprint, the plug connector has exactly two signal conductors for transmitting a differential signal, wherein the first signal conductor has a first electrical contact coupled at a first coupling point and the second signal conductor has a second electrical contact coupled at a second coupling point, wherein the second coupling point is not one of the coupling points which is directly adjacent to the first coupling point of the footprint.

15 Claims, 2 Drawing Sheets

(51) Int. Cl.
*H05K 1/11* (2006.01)
*H01R 12/70* (2011.01)

(52) U.S. Cl.
CPC .............. *H05K 2201/10189* (2013.01); *H05K 2201/10325* (2013.01); *H05K 2201/10356* (2013.01); *H05K 2201/10878* (2013.01)

(58) Field of Classification Search
USPC .................................................. 439/571, 607
See application file for complete search history.

(56) References Cited

U.S. PATENT DOCUMENTS

| | | | | |
|---|---|---|---|---|
| 5,192,228 A * | 3/1993 | Collins | ............... | H01R 23/6873 439/567 |
| 5,254,016 A * | 10/1993 | Ganthier | ............... | H01R 12/714 411/339 |
| 5,586,891 A * | 12/1996 | Kelly | ............... | G01R 1/045 439/70 |
| 5,895,278 A * | 4/1999 | Humphrey | ............ | H01R 12/716 439/101 |
| 7,074,054 B2 * | 7/2006 | Mertz | ....................... | H01R 9/24 439/78 |
| 7,497,731 B2 * | 3/2009 | Rosenfeldt | ........... | H01R 12/721 439/607.01 |
| 8,436,775 B2 * | 5/2013 | Brey | ....................... | H01Q 1/12 343/702 |
| 8,593,825 B2 * | 11/2013 | Chen | ........................ | H01R 12/721 257/296 |
| 8,642,387 B2 * | 2/2014 | Tam | ........................ | H01L 25/50 257/686 |
| 8,951,070 B1 * | 2/2015 | Goodwin | ............. | H01R 12/721 439/660 |
| 9,033,716 B2 * | 5/2015 | Sloey | ..................... | H01R 23/722 439/65 |
| 9,426,888 B2 * | 8/2016 | Bandhu | ............. | H05K 1/0228 |
| 9,722,348 B2 * | 8/2017 | Zebhauser | ........... | H01R 13/514 |
| 2013/0316585 A1 | 11/2013 | McGrath | | |
| 2014/0017956 A1 | 1/2014 | Hashim | | |

\* cited by examiner

Fig. 1a
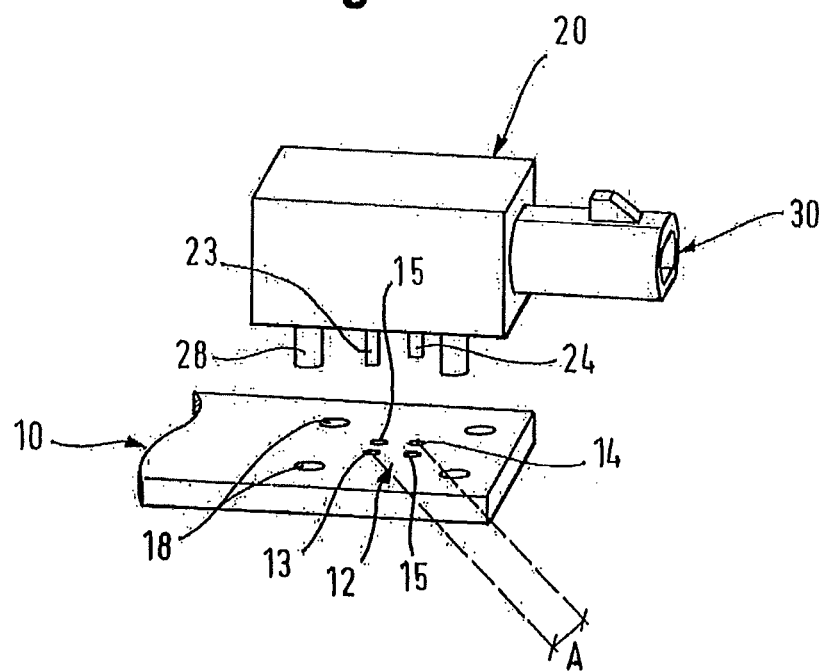
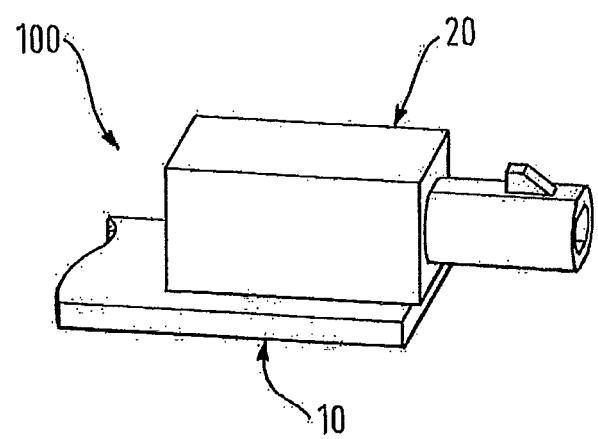
Fig. 1b

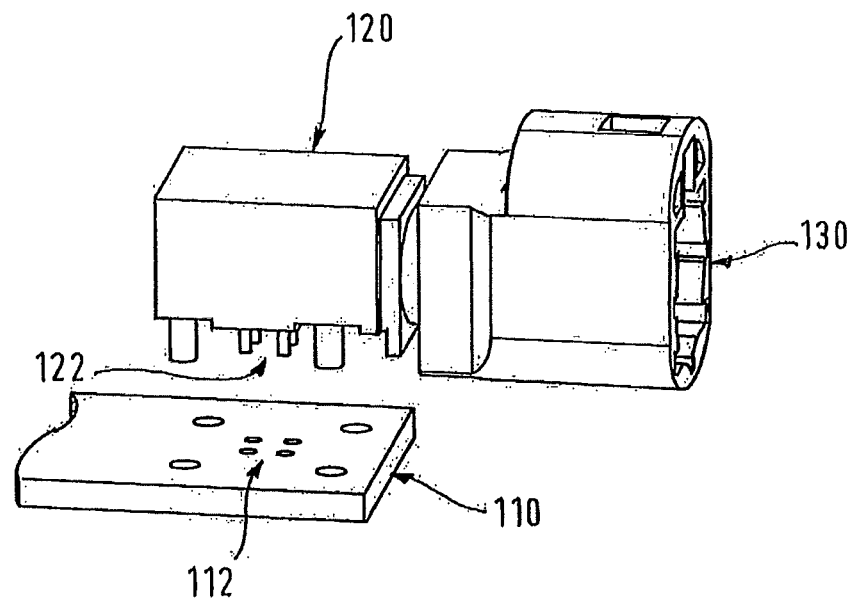
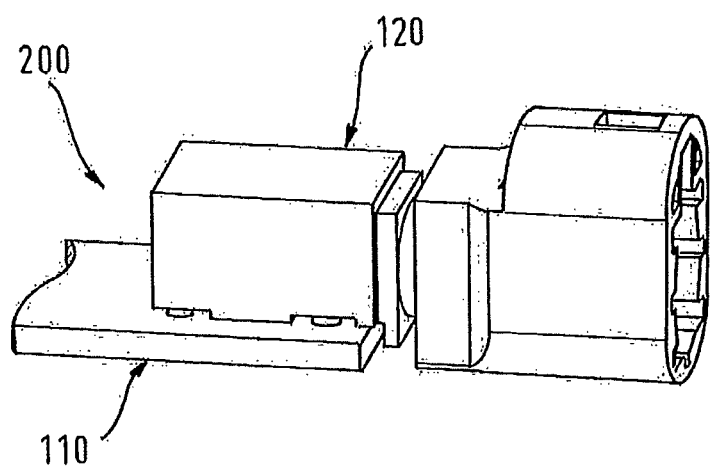

PRINTED CIRCUIT BOARD ASSEMBLY

BACKGROUND OF THE INVENTION

1. Field of the Invention

The invention relates to a printed circuit board assembly with a printed circuit board and a plug connector attached thereto. For this purpose, the printed circuit board has at least one footprint with three or more coupling points set up for coupling electrical contacts of the plug connector.

2. Description of Related Art

A footprint is generally understood to refer to a landing point for a particular component provided in a particular layout on the printed circuit board or circuit board. A finished printed circuit board design consists of a plurality of such component landing points which can be connected with one another by means of traces. Each component has a particular number of electrical contacts in a particular spatial arrangement, which as a rule are to be connected with a corresponding number of matching contacts on the printed circuit board. Therefore, each component, for example a particular circuit board, plug or other electronic component, is accommodated by a quite particular footprint on the printed circuit board. Such a coupling of the individual component contacts to the individual coupling points is as a rule effected by means of soldering.

As a rule, it is necessary to introduce particular signals or voltages into the electrical circuit on the printed circuit board or conduct them away from the printed circuit board by means of a cable. For this purpose, circuit board plug connectors can be attached to the printed circuit board, which are designed to be plugged into by a mating plug connector of the cable. As explained, each type of plug connector is assigned a particular footprint. For example, a plug connector with four signal conductors is usually associated with a footprint with four coupling points, each intended for coupling one electrical contact of the individual signal conductors.

However, a redesign of the hardware or software associated with the printed circuit board generally leads to the printed circuit board being fed fewer electrical signals than previously, so that a plug connector with fewer signal conductors than previously can be sufficient. However, replacing plug connectors is problematic or at least presents problems with installation, since the footprint provided on the circuit board is actually configured for the original plug connector. In particular, a replacement of plug connectors can lead to deterioration in the signal quality of the signals which are still required.

SUMMARY OF THE INVENTION

In view of the described problems it is the object of the present invention to provide a simple-to-install printed circuit board assembly maintaining optimal signal quality following such a redesign.

This problem is solved by means of a printed circuit board assembly according to the independent claims. Advantageous further developments of the invention are described in the dependent claims.

The above and other objects, which will be apparent to those skilled in the art, are achieved in the present invention which is directed to a printed circuit board assembly with a printed circuit board including at least one footprint for attachment of a plug connector, the footprint having three or more coupling points for coupling electrical contacts of the plug connector, and with a plug connector attached to the footprint, wherein the plug connector has exactly two signal conductors for transmitting a differential signal, wherein the first signal conductor has a first electrical contact coupled at a first coupling point of the three or more coupling points, and the second signal conductor has a second electrical contact coupled at a second coupling point of the three or more coupling points, wherein a third, free coupling point is arranged closer to the first or second coupling point than the second or first coupling point, respectively.

The first coupling point and the second coupling point are two coupling points of the footprint with the greatest distance (A) between them.

The footprint may have four coupling points which are arranged in a predetermined pattern on the printed circuit board. The four coupling points can be arranged on the printed circuit board in the form of a rectangle wherein the two electrical contacts are coupled at two diagonally opposite corners of the rectangle. The rectangle may be in the form of a square, such that the two electrical contacts are coupled at two diagonally opposite corners of the square. The coupling points in each case have holes and/or solder points such as solder pads, and/or that the contact elements project in the manner of a pin or tab in the direction of the printed circuit board. The footprint may be configured for attachment of a star quad cable plug connector, and/or the plug connector may be a twisted pair cable plug connector. The star quad cable plug connector may be in the form of a high speed data (HSD) plug, and/or wherein the twisted pair cable plug connector is in the form of a modular twisted-pair data (MTD) plug.

In that manner, the plug connector may have a plugging geometry configured for coupling of a twisted pair cable.

No contact element of the plug connector is coupled to at least one or several further coupling points of the footprint.

The plug connector may have a plurality of attachment projections or attachment pins, which engage in attachment openings in the printed circuit board.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 1a shows a plug connector before attachment to a printed circuit board;

FIG. 1b shows a printed circuit board assembly according to the invention consisting of the plug connector and the printed circuit board from FIG. 1a;

FIG. 2a shows a different plug connector before attachment to the printed circuit board; and FIG. 2b shows a conventional printed circuit board assembly consisting of the plug connector and the printed circuit board from FIG. 2a.

DESCRIPTION OF THE PREFERRED EMBODIMENT(S)

In describing the preferred embodiment of the present invention, reference will be made herein to FIGS. 1-2 of the drawings in which like numerals refer to like features of the invention.

The plug connector attached to the printed circuit board has exactly two signal conductors for transmitting a differential signal, wherein the first signal conductor has a first electrical contact coupled at a first coupling point and the second signal conductor has a second electrical contact coupled at a second coupling point, wherein the second coupling point is not one of the coupling points of the footprint which is directly adjacent the first coupling point.

In other words, not all of the at least three coupling points of the footprint are occupied by electrical contacts of the plug connector. Rather, no electrical contact of the plug connector is coupled to at least one, preferably at two or more, coupling points on the footprint. The two electrical contacts provided, which form a differential contact pair for transmitting a differential signal, are coupled at two coupling points with a large distance between them, that is to say they are not coupled at two directly adjacent coupling points.

The invention is based on the knowledge that having a large distance between the two contact elements of the signal conductor pair means, on the one hand, that the installation of the plug connector on the circuit board is simplified, since optimal use is made of the comparatively large surface area of the over-dimensioned footprint. On the other hand, having a large distance between the two contact elements reliably prevents an accidental contact between the two signal conductors and/or a soldering error. Moreover, assignment of the two contacts is simplified in comparison with a close contact arrangement, preventing, among other things, any confusion during soldering.

Particularly advantageous in this respect is an arrangement in which the first coupling point and the second coupling point represent two coupling points of the footprint with the greatest distance between them. If the geometrical arrangement of the coupling points of the footprint is such that the same greatest distance is present between more than one pair of coupling points, the two electrical contacts of the plug connector are coupled to one of these widely-spaced pairs of coupling points.

In a particularly preferred embodiment of the invention, the footprint has four coupling points which are arranged on the printed circuit board in a predetermined pattern. Thus, the footprint can for example be intended for coupling a four-contact plug connector but, due to a redesign, only a single differential signal needs to be introduced into the printed circuit board by means of the plug connector.

It has proved expedient for the four coupling points to be arranged on the printed circuit board in the form of a rectangle, in particular in the form of a square. A four-contact design of such configuration is particularly compact and makes possible a simple assignment of the individual electrical contacts. In the case of a rectangular arrangement of the coupling points of the footprint, the two electrical contacts of the plug connector are coupled at two diagonally opposite corners of the rectangle, since these coupling points are spaced further apart from one another than two adjacent corners of the rectangle.

A simple and economical coupling of the electrical contacts at the coupling points is made possible in that the coupling points in each case have holes, in particular through-holes, into which the electrical contacts can be inserted in order to make contact. The electrical contacts of the plug connector can also be designed in the form of pins or tabs (complementary in form to the holes) which project from an underside of the plug connector in the direction of the printed circuit board and preferably project into or engage in the holes at the coupling points. Alternatively or additionally, the coupling points can have solder points such as solder pads for soldering-on the contact elements.

The plug connector preferably has a plugging geometry configured for coupling of a twisted pair cable. In other words, the plug connector is configured for connection with a mating plug connector connected to a twisted pair cable. Starting out from the electrical contacts, the signal conductors of the plug connector run through a possibly shielded main part of the plug connector up to the plugging geometry on a plug-side end of the plug connector. On the plug-side end, the signal conductors can have contact pins and/or contact sockets for coupling with complementary mating contact elements of the mating plug connector.

Preferably, the plug connector is designed as an angle plug, in which the electrical contacts project on an underside, while the plugging geometry is provided on a side running transversely, in particular perpendicular thereto. For this purpose, the signal conductors of the plug connector preferably in each case contain at least one bend by around 90°.

In order to improve the stability of attachment of the plug connector on the printed circuit board, the plug connector can have several, preferably four, attachment projections engaging in attachment openings in the printed circuit board. The attachment projections can be designed in the form of attachment pins which can be received in the attachment openings in a form-locking and/or force-locking manner.

In a particularly preferred embodiment of the invention, the footprint is configured for the attachment of a star quad cable plug connector, in particular of a high speed data (HSD) plug. A star quad cable has two signal conductor pairs which are twisted together. Accordingly, a star quad cable plug connector has a total of four signal conductors. Accordingly, the associated footprint has a total of four coupling points. However, the plug connector coupled thereto according to the invention is not the actually intended HSD plug, but a twisted pair cable plug connector, in particular a modular twisted-pair data (MTD) plug, with only two signal conductors.

A conventional printed circuit board assembly 200 is shown in FIG. 2b. It consists of a printed circuit board 110 and an angle plug 120 attached thereto with four signal conductors for transmission of two differential signals with a total of four electrical contacts 122 projecting in the direction of the printed circuit board 110 (see FIG. 2a).

The printed circuit board 110 has a footprint 112 of complementary design with a total of four coupling points (see FIG. 2a). The spatial arrangement of the coupling points corresponds to the spatial arrangement of the electrical contacts 122, so that the electrical contacts 122 in each case make electrical contact with the associated coupling points when the plug connector 120 is attached to the printed circuit board 110 (see FIG. 2b). A plug-side end of the plug connector has a four-contact plugging geometry 130, so that a star quad cable can be connected to the plug connector 120. In this way, the printed circuit board 110 can be fed two differential signals via the star quad cable.

FIG. 1b shows a printed circuit board assembly 100 according to the invention. It consists of a printed circuit board 10 and a plug connector 20 attached thereto with only two signal conductors for transmission of a differential signal with two electrical contacts 23, 24 projecting in the direction of the printed circuit board 10 (see FIG. 1a).

The printed circuit board 10 has a footprint 12 for coupling the electrical contacts 23, 24 with a total of four coupling points 13, 14, 15 (see FIG. 1a). The footprint 12 corresponds to the footprint 112 of the conventional printed circuit board assembly 200. In other words, the footprint 12 has more coupling points than the plug connector 20 has electrical contacts.

In the attached state, which is shown in FIG. 1b, the first electrical contact 23 of the plug connector is electrically coupled at a first coupling point 13 and the second electrical contact 24 of the plug connector is electrically coupled at a second coupling point 14 of the footprint. Consequently, no electrical contact is coupled at two coupling points 15.

According to the invention it is important that the first and second coupling points 13, 14 do not represent coupling points which are directly adjacent one another. In other words, at least one of the free coupling points 15 lies closer to the first (or second) coupling point than the second (or first) coupling point.

In the illustrated embodiment, the four coupling points 13, 14, 15 are arranged in the form of a square, the coupling points each forming a corner of the square. In this case, each of the coupling points has two directly adjacent coupling points (namely the adjacent corners of the square) and a more distant coupling point (namely the diagonally opposite corner of the square). Accordingly, the two electrical contacts 23, 24 of the plug connector are connected with two coupling points 13, 14 which form two corners of the square which are diagonally opposite one another. The first and the second coupling point 13, 14 thus represent a pair of coupling points of the footprint with the greatest distance A between them.

In this way, according to the invention on the one hand the installation of the plug connector 20 on the printed circuit board 10 is facilitated and on the other hand the quality of the signals which are to be transmitted is improved.

The coupling points 13, 14, 15 each have holes for inserting the pin-formed electrical contacts 23, 24. The electrical contacts 23, 24 thereby project from an underside of the plug connector 20 in the direction of the printed circuit board 10. Also, starting out from the underside of the plug connector 20, a total of four attachment pins 28 project which, in the attached state (see FIG. 1b), each engage in an attachment opening 18 on the printed circuit board.

The plugging geometry 30 on the plug-side end of the plug connector 20 is configured for connection of a mating plug connector with two contacts forming a signal conductor pair. In this way, a twisted pair cable, for example, can be connected with the plug connector 20.

In the illustrated embodiment, the footprint has a circuit board layout for coupling a four-contact HSD plug connector, whereby, rather than the actually intended HSD plug, a two-contact MTD plug is attached thereto.

The invention is not limited to the described embodiment. For example, the coupling points can be arranged in a row next to one another, wherein the two electrical contacts are coupled at the two outermost coupling points in the row. Also, the footprint can have more than four, for example six, eight or twelve coupling points. Alternatively or additionally, the plug connector can have an outer conductor housing made of a conductive material which is connected with a ground of the printed circuit board. Other embodiments of a printed circuit board assembly according to the invention are also conceivable.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A printed circuit board assembly with a printed circuit board including at least one footprint for attachment of a plug connector, said footprint having three or more coupling points for coupling electrical contacts of the plug connector, and with the plug connector attached to the footprint, wherein the plug connector has exactly two signal conductors for transmitting a differential signal, wherein the first signal conductor has a first electrical contact coupled at a first coupling point of the three or more coupling points, and the second signal conductor has a second electrical contact coupled at a second coupling point of the three or more coupling points, wherein a distance between a third, free coupling point and the first coupling point is smaller than a distance between the second coupling point and the first coupling point, or a distance between a third, free coupling point and the second coupling point is smaller than a distance between the first coupling point and the second coupling point.

2. The printed circuit board assembly of claim 1, wherein the first coupling point and the second coupling point are two coupling points of the footprint with the greatest distance (A) between them.

3. The printed circuit board assembly of claim 1, wherein the footprint has four coupling points which are arranged in a predetermined pattern on the printed circuit board.

4. The printed circuit board assembly of claim 3, wherein the four coupling points are arranged on the printed circuit board in the form of a rectangle wherein the two electrical contacts are coupled at two diagonally opposite corners of the rectangle.

5. The printed circuit board assembly of claim 1, wherein no electrical contact of the plug connector is coupled to at least one or several further coupling points of the footprint.

6. The printed circuit board assembly of claim 1, wherein the coupling points in each case have holes and/or solder points such as solder pads, and/or that the electrical contacts project in the manner of a pin or tab in the direction of the printed circuit board.

7. The printed circuit board assembly of claim 1, wherein the plug connector has a plugging geometry configured for coupling of a twisted pair cable.

8. The printed circuit board assembly of claim 1, wherein the plug connector has a plurality of attachment projections or attachment pins, which engage in attachment openings in the printed circuit board.

9. The printed circuit board assembly of claim 1, wherein the footprint is configured for attachment of a star quad cable plug connector, and/or that the plug connector is a twisted pair cable plug connector.

10. The printed circuit board assembly of claim 2, wherein the footprint has four coupling points which are arranged in a predetermined pattern on the printed circuit board.

11. The printed circuit board assembly of claim 3, wherein the rectangle is in the form of a square, such that the two electrical contacts are coupled at two diagonally opposite corners of the square.

12. The printed circuit board assembly of claim 10, wherein the rectangle is in the form of a square, such that the two electrical contacts are coupled at two diagonally opposite corners of the square.

13. The printed circuit board assembly of claim 12, wherein the plug connector has a plugging geometry configured for coupling of a twisted pair cable.

14. The printed circuit board assembly of claim 10, wherein the plug connector has a plurality of attachment of four projections or attachment pins, which engage in attachment openings in the printed circuit board.

15. The printed circuit board assembly of claim 9, wherein the star quad cable plug connector is in the form of a high speed data (HSD) plug, and/or wherein the twisted pair cable plug connector is in the form of a modular twisted-pair data (MTD) plug.

\* \* \* \* \*